(12) United States Patent
Ooarata et al.

(10) Patent No.: US 12,490,406 B2
(45) Date of Patent: Dec. 2, 2025

(54) MEASUREMENT DEVICE UNIT

(71) Applicant: DENSO CORPORATION, Kariya (JP)

(72) Inventors: Naoki Ooarata, Kariya (JP); Hajime Yokoyama, Kariya (JP); Yousuke Yamamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 398 days.

(21) Appl. No.: 18/311,725

(22) Filed: May 3, 2023

(65) Prior Publication Data

US 2023/0309259 A1   Sep. 28, 2023

Related U.S. Application Data

(63) Continuation of application No. PCT/JP2021/031308, filed on Aug. 26, 2021.

(30) Foreign Application Priority Data

Nov. 9, 2020   (JP) .................................. 2020-186279

(51) Int. Cl.
H05K 7/20   (2006.01)

(52) U.S. Cl.
CPC ..... *H05K 7/20209* (2013.01); *H05K 7/20145* (2013.01); *H05K 7/20863* (2013.01)

(58) Field of Classification Search
CPC ... B60R 11/04; B60R 2011/004; B60R 11/00; B60R 2011/0098; B60R 2011/005; B60R 16/023; B60R 16/0238; B60R 2011/0064; B60R 2011/008; B60R 2300/102; B60R 2300/301; B60R 9/04; G01D 11/245; G01D 11/30; G01D 11/24; G01D 21/00; G01D 21/02; G01S 2013/93273; G01S 7/027;
(Continued)

(56) References Cited

U.S. PATENT DOCUMENTS 10,359,303 B1 * 7/2019 Krishnan ................ B60R 11/04
10,514,303 B2 * 12/2019 Krishnan .............. G01S 13/931
(Continued)

FOREIGN PATENT DOCUMENTS

CN        208634075 U    3/2019
EP          2955452 A1   12/2015
(Continued)

*Primary Examiner* — Michael A Matey
(74) *Attorney, Agent, or Firm* — Maschoff Brennan

(57) ABSTRACT

A measurement device unit includes: a data processing device; a protection cover covering at least an upper side of the data processing device and defining a space between the protection cover and the data processing device; a front side supply/discharge device provided on a front side of the vehicle, and supplying or discharging air between an outside of the protection cover and the space; a rear side supply/discharge device provided on a rear side of the vehicle, and supplying or discharging the air between the outside of the protection cover and the space; and a supply/discharge control device acquiring at least one item of information on an internal temperature of the protection cover, an external temperature of the protection cover, a traveling direction of the vehicle, presence or absence of a failure in the supply/discharge devices, and controlling air supply and discharge operations, based on the information acquired.

5 Claims, 5 Drawing Sheets

(58) Field of Classification Search
CPC .. G01S 7/4813; G01S 13/86; G01S 2013/932; G01S 2013/9316; E05B 81/64; G07C 9/00309; G07C 9/00571; B60Q 1/0023; B60Y 2306/05; B60Y 2410/10; B62D 25/06; E05F 15/443; G01K 1/08; G01K 1/14; G01K 13/02; G01K 2205/00; G01K 3/005; H05K 7/20209; H05K 7/20145; H05K 7/20863

See application file for complete search history.

(56) References Cited

U.S. PATENT DOCUMENTS

| | | | |
|---|---|---|---|
| 11,584,315 B2* | 2/2023 | Toya | B60R 16/0238 |
| 11,608,082 B1* | 3/2023 | Anderson | B60W 60/00 |
| 2017/0305360 A1* | 10/2017 | Zajac | B60R 11/04 |
| 2019/0212174 A1* | 7/2019 | Krishnan | G01D 21/02 |
| 2021/0227104 A1* | 7/2021 | Krishnan | G07C 9/00571 |
| 2021/0293932 A1* | 9/2021 | Bruce-Wen | G01S 7/4813 |

FOREIGN PATENT DOCUMENTS

| | | |
|---|---|---|
| JP | 2001-233139 A | 8/2001 |
| JP | 2009-109090 A | 5/2009 |
| JP | 2009-260135 A | 11/2009 |

* cited by examiner

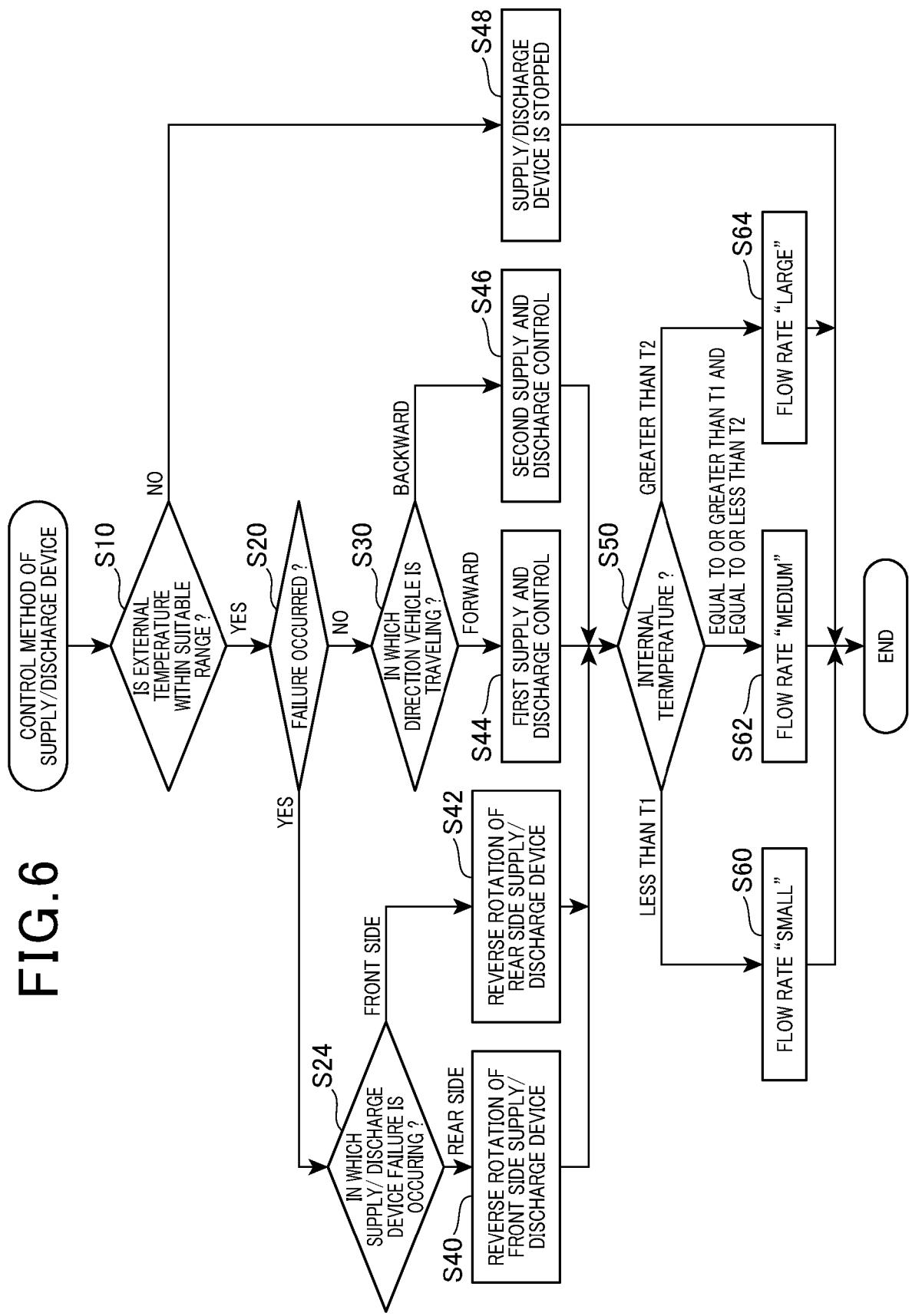

MEASUREMENT DEVICE UNIT

CROSS-REFERENCE TO RELATED APPLICATION

The present application is a continuation application of International Application No. PCT/JP2021/031308, filed on Aug. 26, 2021 which claims priority to Japanese Patent Application No. 2020-186279, filed on Nov. 9, 2020. The contents of these applications are incorporated herein by reference in their entirety.

BACKGROUND

Technical Field

The present disclosure relates to a measurement device unit.

BACKGROUND ART

In a sensor assembly mounted on a vehicle, a technique for introducing an airflow into the inside of a housing from an opening portion provided in the housing, to cool electronic components of the sensor, is known.

SUMMARY

In the present disclosure, provided is a measurement device unit as the following.

The measurement device unit includes: a data processing device; a protection cover covering at least an upper side of the data processing device and defining a space between the protection cover and the data processing device; a front side supply/discharge device provided on a front side of the vehicle, and supplying or discharging air between an outside of the protection cover and the space; a rear side supply/discharge device provided on a rear side of the vehicle, and supplying or discharging the air between the outside of the protection cover and the space; and a supply/discharge control device acquiring at least one item of information on an internal temperature of the protection cover, an external temperature of the protection cover, a traveling direction of the vehicle, presence or absence of a failure in the supply/discharge devices, and controlling air supply and discharge operations, based on the information acquired.

BRIEF DESCRIPTION OF THE DRAWINGS

The above objects, other objects, features, and advantages of the present disclosure will become more apparent from the following detailed description, with reference to the accompanying drawings. In the drawings.

FIG. 6 is a flowchart illustrating a control method of the fan device.

DETAILED DESCRIPTION OF THE PREFERRED EMBODIMENTS

Figure 1:
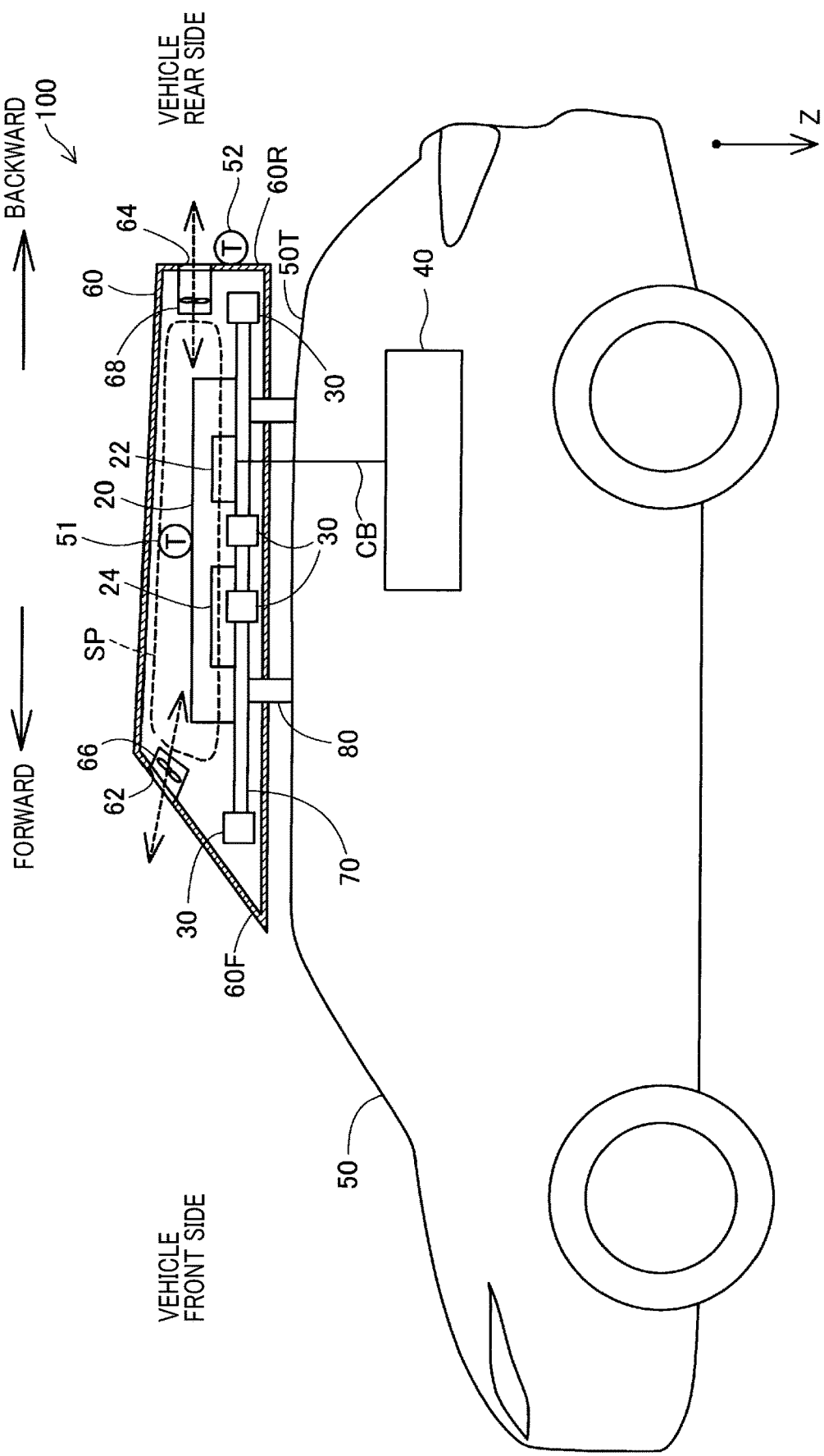
FIG. 1 is an explanatory diagram illustrating a schematic configuration of a measurement device unit.

For example, in the technique described in US 2017/305360 A, the inside and the outside of the housing being simply communicated by the opening portion brings concern that operations of devices in the housing may be affected by the influence of an external temperature or flow of the air.

The present disclosure has been made to address at least some of the above-described issues, and can be implemented as the following aspects or application examples.

According to a first aspect of the present disclosure, a measurement device unit to be mounted to an outside of a vehicle is provided. Such a measurement device unit includes: a data processing device configured to acquire detection data from a detector, and to generate integrated data; a protection cover configured to cover at least an upper side of the data processing device, and be spaced apart from the data processing device to define a space (SP) between the protection cover and the data processing device e; a front side supply/discharge device provided on a front side of the vehicle when mounted on the vehicle, and configured to supply or discharge air between an outside of the protection cover and the space; a rear side supply/discharge device provided on a rear side of the vehicle when mounted on the vehicle, and configured to supply or discharge the air between the outside of the protection cover and the space; and a supply/discharge control device configured to acquire at least one item of information on an internal temperature of the protection cover, an external temperature of the protection cover, a traveling direction of the vehicle, and presence or absence of a failure in the front side supply/discharge device or the rear side supply/discharge device, control air supply and discharge operations of the front side supply/discharge device and the rear side supply/discharge device, based on the information that has been acquired, cause the front side supply/discharge device to take in the air, and cause the rear side supply/discharge device to exhaust the air, in response to the traveling direction of the vehicle being a forward direction, and cause the rear side supply/discharge device to take in the air, and cause the front side supply/discharge device to exhaust the air, in response to the traveling direction of the vehicle being a backward direction.

According to a second aspect of the present disclosure, a measurement device unit to be mounted to an outside of a vehicle is provided. Such a measurement device unit includes: a data processing device configured to acquire detection data from a detector and generate integrated data; a protection cover configured to cover at least an upper side of the data processing device, and be spaced apart from the data processing device to define a space between the protection cover and the data processing device; a front side supply/discharge device provided on a front side of the vehicle when mounted to the vehicle, and configured to supply or discharge air between an outside of the protection cover and the space; a rear side supply/discharge device provided on a rear side of the vehicle when mounted to the vehicle, and configured to supply or discharge the air between the outside of the protection cover and the space; and a supply/discharge control device configured to acquire at least one item of information on an internal temperature of the protection cover, an external temperature of the protection cover, a traveling direction of the vehicle, and presence or absence of a failure in the front side supply/discharge device or the rear side supply/discharge device, control air supply and discharge operations of the front side supply/discharge device and the rear side supply/discharge device, based on the information that has been acquired, acquire the presence or the absence of the failure in the front side supply/discharge device or the rear side supply/discharge device, and in response to the failure being occurring in either one of the front side supply/discharge device or the rear side supply/discharge device, cause the other one of the front side supply/discharge device or the rear side supply/discharge device to exhaust the air.

According to a third aspect of the present disclosure, a measurement device unit to be mounted to an outside of a vehicle is provided. Such a measurement device unit includes: a data processing device configured to acquire detection data from a detector and generate integrated data; a protection cover configured to cover at least an upper side of the data processing device, and be spaced apart from the data processing device to define a space between the protection cover and the data processing device; a front side supply/discharge device provided on a front side of the vehicle when mounted to the vehicle, and configured to supply or discharge air between an outside of the protection cover and the space; a rear side supply/discharge device provided on a rear side of the vehicle when mounted to the vehicle, and configured to supply or discharge the air between the outside of the protection cover and the space; and a supply/discharge control device configured to acquire at least one item of information on an internal temperature of the protection cover, an external temperature of the protection cover, a traveling direction of the vehicle, and presence or absence of a failure in the front side supply/discharge device or the rear side supply/discharge device, and control air supply and discharge operations of the front side supply/discharge device and the rear side supply/discharge device, based on the information that has been acquired, wherein, each of the front side supply/discharge device and the rear side supply/discharge device is a fan device including a plurality of fans that overlap with each other in an axial direction, and the supply/discharge control device is configured to individually control respective rotations of the plurality of fans.

According to the measurement device units of the above aspects, the supply/discharge control device acquires at least any item of information about the internal temperature of the protection cover, the external temperature of the protection cover, the traveling direction of the vehicle, the presence or absence of a failure in the front side supply/discharge device or the rear side supply/discharge device, as information that influences the operation of the data processing device inside the protection cover, and controls the supply and discharge operations of the front side supply/discharge device and the rear side supply/discharge device by using these items of information. Therefore, by properly managing the temperature inside the protection cover, degradation in performance of the data processing device resulting from the temperature can be suppressed. The difference in pressure between the inside and the outside of the protection cover and the air resistance to the protection cover while the vehicle is traveling can be reduced, and the load on the protection cover by the pressure can be reduced.

A. First Embodiment

Using FIG. 1, a measurement device unit 100 will be described as a first embodiment. As illustrated in FIG. 1, the measurement device unit 100 is used, for example, to be mounted on the outside of a vehicle 50, such as a roof 50T of the vehicle 50. In FIG. 1, a forward direction and a rearward direction as traveling directions of the vehicle 50, and a Z direction that coincides with a direction of gravity are illustrated. Hereinafter, a Z direction side with respect to one reference position will also be referred to as a "lower side", an opposite side to Z direction with respect to the reference position will also be referred to as an "upper side". A traveling direction side with respect to the reference position will also be referred to as a "front side", and an opposite side to the traveling direction with respect to the reference position will also be referred to as a "rear side". A direction perpendicular to the traveling direction of the vehicle will also be referred to as a "width direction". In addition to the roof 50T of the vehicle, the measurement device unit 100 may be mounted on the outside on the front side, the rear side, and a lateral side, or the lower side of the vehicle 50.

The measurement device unit 100 includes a support member 80, a support frame 70, a plurality of sensors 30, a data processing device 22 and a supply/discharge control device 24, which are housed in a housing body 20, a protection cover 60, a first fan device 66, and a second fan device 68. The support member 80 secures the support frame 70 and the protection cover 60 above the roof 50T to be spaced apart from the roof 50T of the vehicle 50. The support frame 70 has a substantially plate shape in appearance. The support frame 70 is secured onto the vehicle 50 by the support member 80 with its surface direction facing the roof 50T of the vehicle 50. A plurality of sensors 30 are each disposed at the periphery edge of the support frame 70, and the support frame 70 supports the housing body 20, which is mounted on an upper surface side of the support frame 70. The sensors 30 are each, for example, a detector such as a camera for acquiring image data of a target object, a LiDAR (Light Detection and Ranging) for acquiring a distance or the like to the target object, and a millimeter wave radar for acquiring the distance or the like to the target object. In the present embodiment, the plurality of sensors 30 include a plurality of different types of detectors. Detection data from each sensor 30 is output to the data processing device 22. The sensors 30 may include various types of detectors, such as ultrasonic sensors, or sensors using other electromagnetic waves or light. The sensors 30 may be a plurality of detectors of one type, or may include detectors of two or more types.

In the present embodiment, the measurement device unit 100 further includes a first temperature sensor 51, which is disposed in the inside of the protection cover 60, and a second temperature sensor 52, which is disposed outside of the protection cover 60. The first temperature sensor 51 detects the temperature inside the protection cover 60 (hereinafter, also referred to "internal temperature"), and the second temperature sensor 52 detects the temperature outside the protection cover 60 (hereinafter, also referred to as "external temperature").

The housing body 20 is a housing having dustproof and waterproof functions, and houses the data processing device 22 and the supply/discharge control device 24 in its inside. The data processing device 22 and the supply/discharge control device 24 are each a microcomputer including a pre-programmed logic circuit. The data processing device 22 and the supply/discharge control device 24 are communicatively connected with a operation assistance control device 40 in the vehicle 50 through wiring CB.

The data processing device 22 acquires detection data from the sensors 30, and generates integrated data. The data processing device 22 outputs the integrated data that has been generated to the operation assistance control device 40.

The operation assistance control device 40 is a so-called ECU (engine control unit) mounted to the vehicle 50, and performs operation assistance for the vehicle 50 by using information about a target object present in the surroundings of the vehicle 50 to be input from the data processing device 22. The operation assistance of the vehicle 50 includes, for example, braking assistance, steering assistance, driving assistance, and the like to be performed by using the information about the target object present in the surroundings of the vehicle 50 to be input from the measurement device unit 100.

The supply/discharge control device 24 controls the first fan device 66 and the second fan device 68 by using the internal temperature and the external temperature that have been acquired from the respective temperature sensors 51 and 52, operation information of the vehicle 50 that has been acquired from the operation assistance control device 40, and failure information of the first fan device 66 and the second fan device 68, and the like. The "operation information of the vehicle 50" means each item of information including travel information of the vehicle 50, for example, the traveling direction including a forward direction and a backward direction of the vehicle 50, a vehicle speed, a yaw rate, a steering angle, and an operation on a direction indicator of the vehicle 50, and the like as well as environmental information of such as environmental brightness, weather, GNSS (global satellite navigation system).

The protection cover 60 is a housing that encloses the support frame 70 and the housing body 20. The protection cover 60 is formed of a material such as a reinforced resin, carbon, or a metal, and suppresses or prevents each enclosed member from being exposed to the outside air or solar radiation. In the present embodiment, the protection cover 60 has a hexahedral external shape consisting of a front surface, a rear surface, a left side surface, a right side surface, an upper surface, and a lower surface. Each surface of the protection cover 60 covers the outer circumference of the housing body 20. The protection cover 60 is disposed to be spaced apart from the housing body 20, and forms a space SP between the protection cover 60 and the housing body 20. Other than a polyhedron such as a hexahedron, the outer shape of the protection cover 60 may be a sphere, or may have any of various shapes capable of enclosing the support frame 70 and the housing body 20. The outer shape of the protection cover 60 preferably has a shape that reduces air resistance while the vehicle 50 is traveling. In the present embodiment, the front surface of the protection cover 60 is inclined as approaching the rear side of the vehicle 50 so as to reduce the air resistance while the vehicle 50 is traveling.

The protection cover 60 includes a front end portion 60F corresponding to the front side of the vehicle 50, and a rear end portion 60R corresponding to the rear side of the vehicle 60 in a case where the measurement device unit 100 is mounted to the vehicle 50. In the present embodiment, the front end portion 60F means a front surface of the protection cover 60, and the rear end portion 60R means a rear surface of the protection cover 60. In addition to the front surface of the protection cover 60, the front end portion 60F can also include areas which are a left side surface, a right side surface, an upper surface, and a lower surface of the protection cover 60 and which are on the front side of the center of the protection cover 60. In addition to the rear surface of the protection cover 60, the rear end portion 60R can also include areas which are a left side surface, a right side surface, an upper surface, and a lower surface, and which are on the rear side of the center of the protection cover 60.

The front end portion 60F and the rear end portion 60R of the protection cover 60 are respectively provided with a first opening portion 62 and a second opening portion 64. The first opening portion 62 and the second opening portion 64 are each a circular opening formed in the protection cover 60. The first opening portion 62 is provided in the front end portion 60F, and communicates the outside of the protection cover 60 with the space SP. The second opening portion 64 is provided in the rear end portion 60R, and communicates the space SP with the outside of the protection cover 60. The shapes of the first opening portion 62 and the second opening portion 64 are not limited to a circular shape, and may be a polygon such as a rectangle. Regarding the number of the first opening portions 62 and the number of the second opening portions 64, a single opening portion may be provided for each of them, or a plurality of opening portions may be provided for each of them.

In the present embodiment, the first fan device 66 is provided in the first opening portion 62 and the second fan device 68 is provided in the second opening portion 64. The first fan device 66 and the second fan device 68 are each a so-called propeller-type fan device, the driving of which is controlled by the air supply/discharge control device 24. The control of driving the fan devices 66 and 68 by the supply/discharge control device 24 includes control of switching the rotation direction of the fan between normal rotation and reverse rotation, an increase and a decrease of the rotation speed of the fan, an adjustment for a rotation phase of the fan, and the like. Regarding the rotation direction of the fan, the normal rotation direction means a rotation direction for taking in the air from outside the protection cover 60 to guide the air into the space SP, and the reverse rotation direction means a rotation direction for discharging the air from inside the space SP to the outside of the protection cover 60. For example, in a case where the first fan device 66 is controlled to be in the normal rotation direction and the second fan device 68 is controlled to be in the reverse rotation direction (hereinafter, also referred to as "first supply and discharge control"), the first fan device 66 takes in the air from outside the protection cover 60 from the first opening portion 62 to guide the air into the space SP, and the second fan device 68 discharges the air from inside the space SP from the second opening portion 64 to the outside of the protection cover 60. In a case where the second fan device 68 is controlled in the normal rotation direction and the first fan device 66 is controlled in the reverse rotation direction (hereinafter, also referred to as "second supply and discharge control"), the second fan device 68 takes in the air from outside the protection cover 60 from the second opening portion 64 to guide the air into the space SP, and the first fan device 66 discharges the air from inside the space SP from the first opening portion 62 to the outside of the protection cover 60. That is, the first fan device 66, in the front end portion 60F, functions as a front side supply/discharge device for supplying and/or discharging the air between the outside of the protection cover 60 and the space SP. The second fan device 68, in the rear end portion 60R, functions as a rear side supply/discharge device for supplying and discharging the air between the outside of the protection cover 60 and the space SP.

Detailed configurations of the fan devices 66 and 68 will be described with reference to FIGS. 2 to 5. The configuration of the first fan device 66 and the configuration of the second fan device 68 are similar to each other, and the second fan device 68 will be described as an example.

Figure 2:
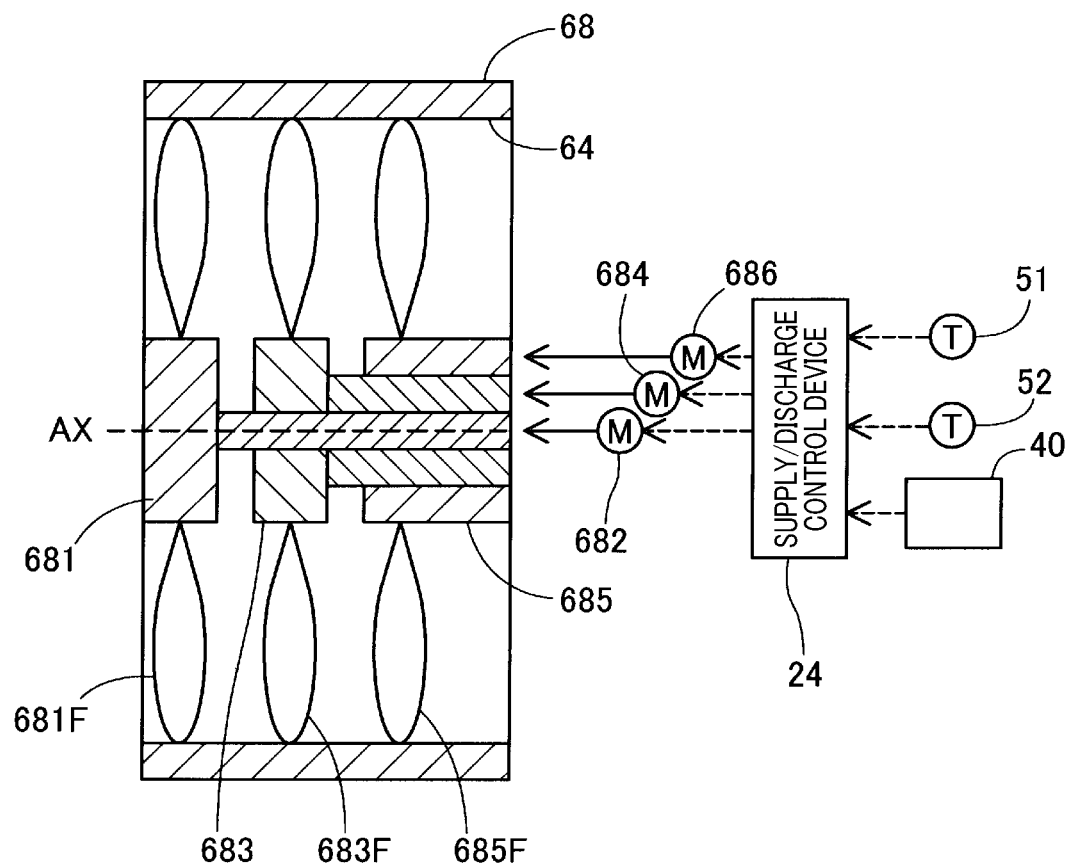
FIG. 2 is an explanatory diagram illustrating a schematic configuration of a fan device.
Figure 3:
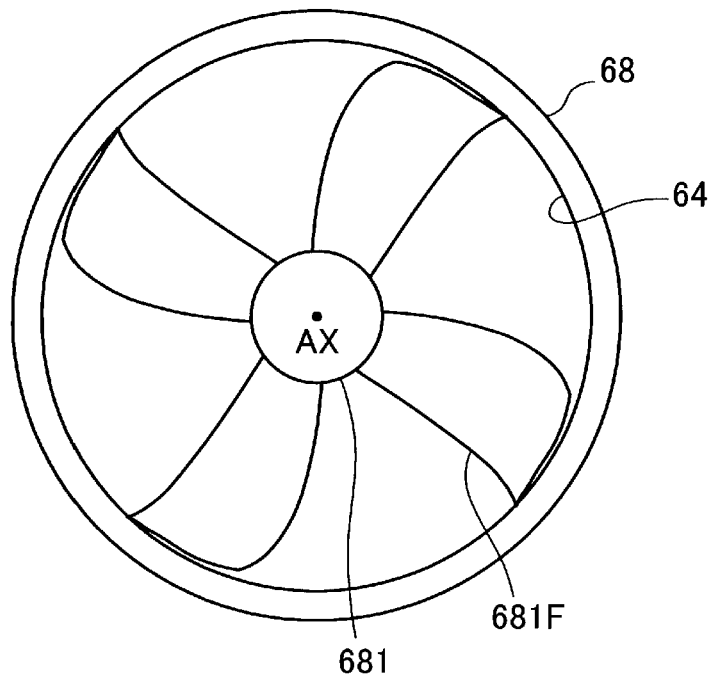
FIG. 3 is a first explanatory diagram illustrating a configuration of fans of the fan device.

As illustrated in FIG. 2, the second fan device 68 includes three fans 681F, 683F, and 685F. As illustrated in FIG. 3, the fan 681F includes four blades with an internal angle of 90 degrees. The structures of 683F and 685F are common to the structure of the fan 681F. The fans 681F, 683F, and 685F are disposed to overlap each other in the axial direction. The second fan device 68 includes three rotation shafts 681, 683, and 685 corresponding to the respective fans. Center axes AX of the rotation shafts 681, 683, and 685 coincide with one another, and the rotation axes of the fans 681F, 683F, and 685F coincide with one another. Drive units 682, 684, and 686 are motors for rotationally driving the respective rotation shafts, and are respectively connected with the rotation shafts 681, 683, and 685.

Figure 4:
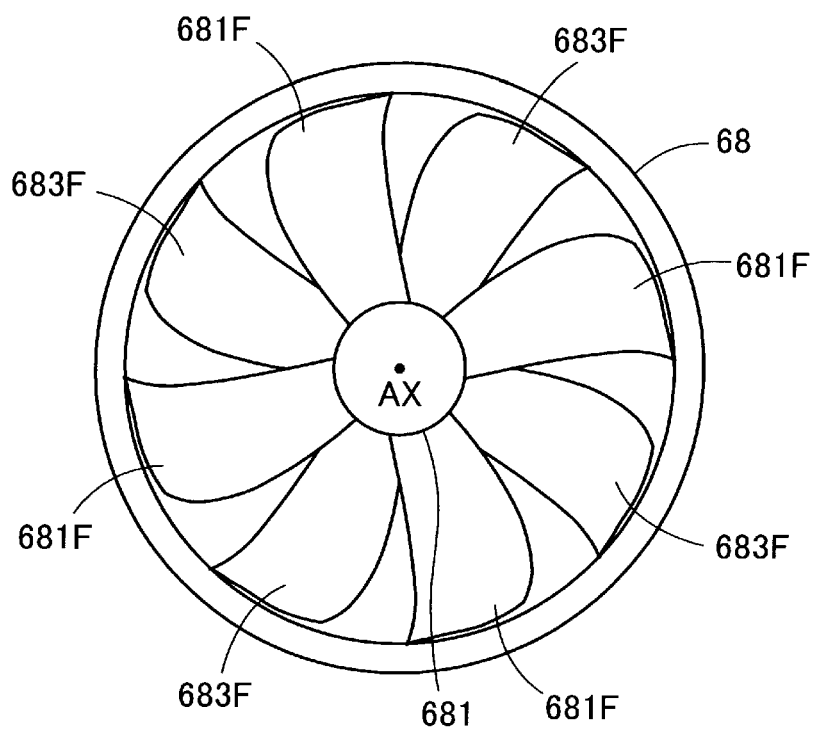
FIG. 4 is a second explanatory diagram illustrating a configuration of the fans of the fan device.
Figure 5:
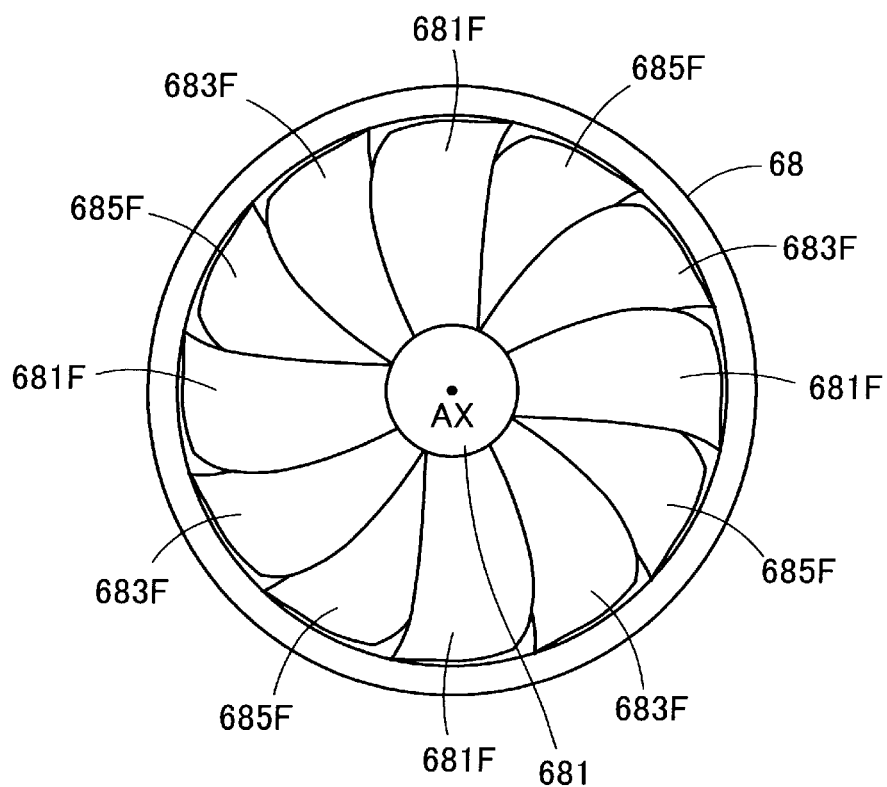
FIG. 5 is a third explanatory diagram illustrating a configuration of the fans of the fan device.

The supply/discharge control device 24 individually controls the drive units 682, 684, and 686 to individually control the rotations of the fans 681F, 683F, and 685F. By selectively changing the fans 681F, 683F, and 685F for rotation, the supply/discharge control device 24 is capable of adjusting the flow rate of the air to be taken into the protection cover 60. By rotating only the fan 681F, for example, as illustrated in FIG. 3, the supply/discharge control device 24 is capable of reducing the flow rate of the air, and by rotating the two fans 681F and 683F, as illustrated in FIG. 4, the supply/discharge control device 24 is capable of increasing the flow rate of the air, as compared with the case of rotating only the fan 681F. In a case of rotating a plurality of fans, a rotation phase difference between the fans is preferably set in order to increase the flow rate of the air efficiently. FIG. 5 illustrates the second fan device 68 in a stopped state. As illustrated in FIG. 5, when stopping the second fan device 68, the supply/discharge control device 24 stops the fans 681F, 683F, and 685F with the rotation phases respectively shifted by 30 degrees. The blades of the respective fans cover the opening of the second opening portion 64 in a plan view, and are capable of stopping the supply and/or discharge function of the second fan device 68. In this manner, by controlling the rotations of the fans 681F, 683F, and 685F of the second fan device 68, the supply/discharge control device 24 is capable of switching between the supply and discharge directions of the air in the second opening portion 64, between on and off of the supply and discharge, and between an increase and a decrease of the supply and/or discharge flow rate. The second fan device 68 may separately include a shutter for stopping the flow of the air in the second opening portion 64.

Using FIG. 6, a method for controlling the fan devices 66 and 68 by the supply/discharge control device 24 will be described. The control illustrated in FIG. 6 is started, for example, by electric power being supplied to the supply/discharge control device 24 due to the start of the vehicle 50.

The supply/discharge control device 24 acquires the external temperature of the protection cover 60 from the second temperature sensor 52, and determines whether the external temperature is within a predetermined suitable range (step S10). The "suitable range of the external temperature" means a range of the external temperatures at which the sensor 30 and/or the data processing device 22 are capable of operating normally, even though the outside air is introduced into the space SP inside the protection cover 60. In the present embodiment, the suitable range of the external temperatures is set within a temperature range that is equal to or greater than a second lower limit value and equal to or less than a second upper limit value. In a case where the external temperature is outside the suitable temperature range, when the outside air is taken into the protection cover 60, the detection accuracy of the sensor 30 may be degraded, and the processing capability of the data processing device 22 may be degraded. In a case where the external temperature is lower than the suitable temperature, the introduction of the outside air may lower the temperature inside the protection cover 60, and may cause condensation inside the protection cover 60. The second lower limit value and the second upper limit value are preferably temperatures for suppressing or preventing these situations. In the present embodiment, 0° C. is set to the second lower limit value, and 50° C. is set to the second upper limit value. In a case where the external temperature is lower than 0° C. or higher than 50° C., the supply/discharge control device 24 determines that the external temperature is outside the suitable range (S10: NO), stops the fan devices 66 and 68 with the rotation phases respectively shifted by 30 degrees to close the respective opening portions 62 and 64 (step S48), and ends the processing. In step S48, the supply/discharge control device 24, instead of stopping the fan devices 66 and 68, may reduce the flow rate of the air in the supply and/or discharge by the fan devices 66 and 68.

In a case where the external temperature is within the suitable temperature range that is equal to or higher than 0° C. and equal to or lower than 50° C., the supply/discharge control device 24 determines that the external temperature is within the suitable range (S10: YES), and determines presence or absence of a failure in the fan devices 66 and 68 (step S20). It is possible to determine the presence or absence of the failure in the fan devices 66 and 68 by presence or absence of receipt of status signals from the fan devices 66 and 68 and presence of absence of receipt of response signals from the fan devices 66 and 68 in response to control signals that have been transmitted from the supply/discharge control device 24. For example, when a failure occurs in a fan device that exhausts the air, the air inside the protection cover 60 is less likely to be discharged. In such a situation, while the vehicle 50 is continuously traveling, the inside of the protection cover 60 becomes negative in pressure, and thus may lead to a load on the protection cover 60 due to a difference in pressure between the inside and the outside of the protection cover 60 or an increase in air resistance to the protection cover 60. In the present embodiment, in a case of determining that a failure is occurring in any of the fan devices 66 and 68 (S20: YES), the supply/discharge control device 24 starts a recovery by use of either the fan device 66 or 68 in which a failure is not occurring. The supply/discharge control device 24 determines in which of the fan devices 66 and 68 the failure is occurring (step S24). In a case of determining that the failure is occurring in the first fan device 66 (S24: front side), the supply/discharge control device 24 starts control of reversing the rotation direction of the second fan device 68, regardless of the traveling state or the like of the vehicle 50, and causes the second fan device 68 to start exhausting the air (step S42). In a case of determining that the failure is occurring in the second fan device 68 (S24: rear side), the supply/discharge control device 24 starts control of reversing the rotation direction of the first fan device 66, regardless of the traveling state or the like of the vehicle 50, and causes the first fan device 66 to start exhausting the air (step S40).

In a case of determining that no failure is occurring in the fan device 66 or 68 (S20: NO), the supply/discharge control device 24 acquires driving information of the vehicle 50 from the operation assistance control device 40, and determines the traveling direction of the vehicle 50 (step S30). The supply/discharge control device 24 may acquire the position of a shift lever or a select lever of the vehicle 50 to determine the traveling direction of the vehicle 50. While the vehicle 50 is moving forward (S30: forward), the supply/discharge control device 24 starts the first supply and discharge control for the fan devices 66 and 68 to introduce the flow of the air generated by the forward movement of the vehicle 50 into the space SP from the first fan device 66 and discharge the air from the second fan device 68 (step S44). While the vehicle 50 is moving rearward (S30: rearward), the supply/discharge control device 24 starts the second supply and discharge control for the fan devices 66 and 68 to introduce the flow of the air generated by the rearward movement of the vehicle 50 into the space SP from the second fan device 68 and discharge the air from the first fan device 66 (step S46).

When any of the controls from step S40 to step S46 is determined, the supply/discharge control device 24 acquires the temperature inside the protection cover 60 from the first temperature sensor 51, and changes the rotation speed of the fan devices 66 and 68 in accordance with the internal temperature (step S50). A "suitable range of the internal temperature" means a range of temperatures at which the sensor 30 and/or the data processing device 22 are capable of normally operating. In the present embodiment, the suitable range of the internal temperature is preset as a temperature range that is equal to or greater than a first lower limit value T1 and equal to or less than a first upper limit value T2. In a case where the temperature inside the protection cover 60 is within the suitable range, the driving of the fan devices 66 and 68 is controlled at a rotation speed serving as an ordinary condition. In a case where the temperature inside the protection cover 60 is not within the suitable range, the rotation speeds of the fan devices 66 and 68 is changed in accordance with the internal temperature. In a case where the internal temperature is, for example, lower than the suitable range, when the outside air is taken into the inside, the temperature inside the protection cover 60 may be lowered due to over-cooling, and condensation may occur inside the protection cover 60. In a case where the internal temperature is higher than the suitable range, the detection accuracy of the sensor 30 may be degraded, and in addition, the processing capability of the data processing device 22 may be degraded. The first lower limit value T1 and the first upper limit value T2 are preferably set to temperatures for suppressing or preventing these situations. The first lower limit value T1 is preferably set to a temperature equal to or higher than the second lower limit value and lower than the first upper limit value T2. In the present embodiment, the first lower limit value T1 is 10° C. The first upper limit value T2 is preferably set to a temperature higher than the first lower limit value T1 and equal to or lower than the second upper limit value. In the present embodiment, the first upper limit value T2 is 30° C.

In step S50, the supply/discharge control device 24 determines whether the internal temperature that has been acquired corresponds to any of (1) less than the first lower limit value T1, (2) equal to or greater than the first lower limit value T1 and equal to or less than the first upper limit value T2, and (3) greater than the first upper limit value T2. In a case where the internal temperature that has been acquired is within the suitable range (S50: equal to or greater than T1 and equal to or less than T2), the supply/discharge control device 24 controls driving of two of the fans respectively included in the fan devices 66 and 68 so as to set the flow rate of the air in the supply and discharge control to a medium flow rate serving as an ordinary condition that is less than the flow rate in step S64 and greater than the flow rate in step S60 (step S62). In a case where the internal temperature that has been acquired is lower than the first lower limit value T1 (S50: smaller than T1), the supply/discharge control device 24 drives one of the fans respectively included in the fan devices 66 and 68 so as to set the flow rate of the air in the supply and discharge control to be less than that of the ordinary condition (step S60). In a case where the internal temperature that has been acquired is greater than the first upper limit value T2 (S50: greater than T2), the supply/discharge control device 24 operates all the fans respectively included in the fan devices 66 and 68 so as to maximize the flow rate of the air (step S64). The flow rate controlled by the supply/discharge control device 24 may be adjusted by an increase or a decrease of the rotation speeds of the fans, instead of the number of operating fans.

As described heretofore, according to the measurement device unit 100 in the present embodiment, the supply/discharge control device 24 acquires at least any of items of information about the temperature inside the protection cover 60, the external temperature of the protection cover 60, the traveling direction of the vehicle 50, and the presence or absence of a failure of the fan devices 66 and 68, as information that influences the operations of the data processing device 22 and the sensors 30 inside the protection cover 60, and controls the supply and discharge operation of the fan devices 66 and 68 by using these items of information. Therefore, the temperature inside the protection cover 60 is properly managed, so that a degradation in performance of the data processing device 22 and the sensors 30 resulting from the temperature can be suppressed. The difference in pressure between the inside and the outside of the protection cover 60 and the air resistance to the protection cover 60 during traveling can be reduced, and the load due to the pressure on the protection cover 60 can be reduced.

According to the measurement device unit 100 in the present embodiment, while the vehicle 50 is moving forward, the first supply and discharge control is performed, and the flow of the air is introduced from the outside by the first fan device 66 taking in the air, and is exhausted from the second fan device 68. While the vehicle 50 is moving rearward, the second supply and discharge control is performed, and the flow of the air is introduced from the outside by the second fan device 68 taking in the air, and is exhausted from the first fan device 66. Therefore, the supply and discharge control corresponding to switching of the traveling direction of the vehicle 50 can be performed, the difference in pressure between the inside and the outside of the protection cover 60 and the air resistance to the protection cover 60 while traveling can be reduced, and the load due to the pressure on the protection cover 60 can be reduced.

According to the measurement device unit 100 in the present embodiment, the supply/discharge control device 24 acquires the presence or absence of a failure in the fan devices 66 and 68, and when it is determined that the failure is occurring in any of the fan devices 66 and 68, performs a recovery by use of either the fan device 66 or 68 in which the failure is not occurring. Therefore, it becomes possible to suppress or prevent a difference in pressure between the inside and the outside of the protection cover 60 such that the air inside the protection cover 60 is not discharged and the inside of the protection cover 60 becomes negative in pressure, and an increase in air resistance to the protection cover 60.

According to the measurement device unit 100 in the present embodiment, the supply/discharge control device 24 acquires the temperature inside the protection cover 60. In a case where the internal temperature that has been acquired is less than the first lower limit value T1, the supply/discharge control device 24 makes the flow rate of the air lower than that in the ordinary condition, and in a case where the internal temperature that has been acquired is greater than the first upper limit value T2, the supply/discharge control device 24 maximizes the flow rate of the air. Therefore, the temperature inside the protection cover 60 can be kept within a suitable range, so that an occurrence of condensation inside the protection cover 60 can be prevented or suppressed, and the detection accuracy of the sensors 30 and the processing capability of the data processing device 22 can be prevented or suppressed from being degraded.

According to the measurement device unit 100 in the present embodiment, the supply/discharge control device 24 acquires the external temperature of the protection cover 60. In a case where the external temperature is outside the proper temperature range, the supply/discharge control device 24 stops the fan devices 66 and 68 or reduces the flow rate of the air in the supply and discharge. Therefore, the outside air that is outside the suitable temperature range can be suppressed from being taken into the protection cover 60, the temperature inside the protection cover 60 can be kept within the suitable range, occurrence of condensation in the protection cover 60 can be prevented or suppressed, and the detection accuracy of the sensors 30 and the processing capability of the data processing device 22 can be prevented from being degraded.

According to the measurement device unit 100 in the present embodiment, the fan devices 66 and 68 each include a plurality of fans 681F, 683F, and 685F, which overlap each other in the axial direction of the fans, and the supply/discharge control device 24 individually controls the rotation of each of the plurality of fans 681F, 683F, and 685F. The provision of the plurality of fans enables the supply and discharge direction of the air and on and off of the supply and discharge of the opening portions 62 and 64 with higher accuracy, and also enables an increase of the range for increasing and decreasing the flow rate of the air to be supplied and discharged.

B. Other Embodiments (B1) In the above embodiment, the description has been given with regard to an example in which the first fan device 66 and the second fan device 68 are each a propeller-type fan device. However, for the first fan device 66 and the second fan device 68, various types of fan devices such as a blower type or a cross-flow type may be used, in addition to the propeller type.

(B2) In the above embodiment, the first opening portion 62 and the second opening portion 64 are each a circular opening formed in the protection cover 60. In contrast, the first opening portion 62 and the second opening portion 64 may be each a duct having a rectangular shape longer in the width direction and formed in the protection cover 60.

(B3) In the above embodiment, the supply/discharge control device 24 is housed in the housing body 20. However, the supply/discharge control device 24 may be provided in the fan device 66 or 68.

(B4) In the above embodiment, the fan devices 66 and 68 are respectively provided in the front end portion 60F and the rear end portion 60R of the protection cover 60. In contrast, together with the fan devices 66 and 68 or instead of the fan devices 66 and 68, may be provided on a side surface of the protection cover 60. According to the measurement device unit configured in this manner, even while the vehicle 50 is turning, intake and/or exhaust of the air is properly enabled, the difference in pressure between the inside and the outside of the protection cover 60 and the air resistance to the protection cover 60 during traveling can be reduced, and the load caused by the pressure on the protection cover 60 can be reduced. The fan devices 66 and 68 may be provided on the support frame 70, without being limited to the protection cover 60.

(B5) In the above embodiment, the supply/discharge control device 24 individually determines whether the internal temperature is within the suitable range, and determines whether the external temperature is within the suitable range. Regarding whether the external temperature is within the suitable range, for example, in a case where the external temperature is largely different from the internal temperature, whether the external temperature is within the suitable range may be determined by using a degree of the difference between the internal temperature and the external temperature, and the flow rate may be adjusted in stepwise control of the fan devices 66 and 68 in accordance with the degree of the difference between the internal temperature and the external temperature, such as stopping of the fan devices 66 and 68. The supply/discharge control device 24 may perform the supply and discharge control with the fan devices 66 and 68, regardless of the external temperature, and may perform the supply and discharge control with the fan devices 66 and 68, based only on whether the internal temperature is within the suitable range.

(B6) In the method for controlling the fan devices 66 and 68 in the above embodiment, all of the steps S10, S20, S24, S30, and S50 are performed. In contrast, in the method for controlling the fan devices 66 and 68, any optional processing only or any combination thereof may be performed.

(B7) In the above embodiment, the fan devices 66 and 68 each include the plurality of fans 681F, 683F, and 685F. However, in a case where the flow rate adjustment by the fan devices 66 and 68 is sufficient, only a single fan may be provided, and the flow rate of the supply and exhaust may be adjusted by controlling the rotation speed of such a single fan.

The control unit and its techniques described in the present disclosure may be implemented by a dedicated computer that is provided by configuring a processor programmed to perform one or a plurality of functions embodied by a computer program and a memory. Alternatively, the control unit and its techniques described in the present disclosure may be implemented by a dedicated computer that is provided by configuring a processor with one or a plurality of dedicated hardware logic circuits. Alternatively, the control unit and its techniques described in the present disclosure may be implemented by one or a plurality of dedicated computers configured with a combination of a processor programmed to perform one or a plurality of functions, a memory, and a processor configured with one or a plurality of hardware logic circuits. In addition, the computer program may also be stored in a computer-readable non-transitory tangible storage medium, as instructions to be executed by a computer.

The present disclosure is not limited to the embodiments and modifications described above, and may be implemented in various configurations without departing from the gist thereof. For example, embodiments corresponding to technical features in each of the aspects described in Summary of the Invention and technical features in modifications may be substituted or combined, as appropriate, to solve some or all of the above-described problems, or to achieve some or all of the above-described effects. In addition, if the technical feature is not described herein as essential, it is possible to delete it as appropriate.

What is claimed is:

1. A measurement device unit to be mounted to an outside of a vehicle, the measurement device unit comprising:
    a data processing device configured to acquire detection data from a detector, and generate integrated data;
    a protection cover configured to cover at least an upper side of the data processing device, and be spaced apart from the data processing device to define a space between the protection cover and the data processing device;
    a front side supply/discharge device provided on a front side of the vehicle when mounted to the vehicle, and configured to supply or discharge air between an outside of the protection cover and the space;
    a rear side supply/discharge device provided on a rear side of the vehicle when mounted to the vehicle, and configured to supply or discharge the air between the outside of the protection cover and the space; and
    a supply/discharge control device configured to
        acquire at least one item of information on an internal temperature of the protection cover, an external temperature of the protection cover, a traveling direction of the vehicle, and presence or absence of a failure in the front side supply/discharge device or the rear side supply/discharge device,
        control air supply and discharge operations of the front side supply/discharge device and the rear side supply/discharge device, based on the information that has been acquired,
        cause the front side supply/discharge device to take in the air, and cause the rear side supply/discharge device to exhaust the air, in response to the traveling direction of the vehicle being a forward direction, and
        cause the rear side supply/discharge device to take in the air, and cause the front side supply/discharge device to exhaust the air, in response to the traveling direction of the vehicle being a backward direction.

2. The measurement device unit according to claim 1, wherein the supply/discharge control device is configured to:
    acquire the internal temperature,
    control the air supply and discharge operations of the front side supply/discharge device and the rear side supply/discharge device to increase a flow rate of the air, in response to the internal temperature being greater than a predetermined first upper limit value, and
    control the air supply and discharge operations of the front side supply/discharge device and the rear side supply/discharge device to reduce the flow rate of the air, in response to the internal temperature being less than a predetermined first lower limit value which is less than the first upper limit value.

3. The measurement device unit according to claim 1, wherein
    the supply/discharge control device is configured to:
        acquire the external temperature, and
        control the air supply and discharge operations of the front side supply/discharge device and the rear side supply/discharge device to reduce a flow rate of the air, in response to the external temperature being greater than a predetermined second upper limit value, or in response to the external temperature being less than a predetermined second lower limit value which is less than the second upper limit value.

4. A measurement device unit to be mounted to an outside of a vehicle, the measurement device unit comprising:
    a data processing device configured to acquire detection data from a detector and generate integrated data;
    a protection cover configured to cover at least an upper side of the data processing device, and be spaced apart from the data processing device to define a space between the protection cover and the data processing device;
    a front side supply/discharge device provided on a front side of the vehicle when mounted to the vehicle, and configured to supply or discharge air between an outside of the protection cover and the space;
    a rear side supply/discharge device provided on a rear side of the vehicle when mounted to the vehicle, and configured to supply or discharge the air between the outside of the protection cover and the space; and
    a supply/discharge control device configured to
        acquire at least one item of information on an internal temperature of the protection cover, an external temperature of the protection cover, a traveling direction of the vehicle, and presence or absence of a failure in the front side supply/discharge device or the rear side supply/discharge device,
        control air supply and discharge operations of the front side supply/discharge device and the rear side supply/discharge device, based on the information that has been acquired,
        acquire the presence or the absence of the failure in the front side supply/discharge device or the rear side supply/discharge device, and
        in response to the failure being occurring in either one of the front side supply/discharge device or the rear side supply/discharge device, cause the other one of the front side supply/discharge device or the rear side supply/discharge device to exhaust the air.

5. A measurement device unit to be mounted to an outside of a vehicle, the measurement device unit comprising:
    a data processing device configured to acquire detection data from a detector and generate integrated data;
    a protection cover configured to cover at least an upper side of the data processing device, and be spaced apart from the data processing device to define a space between the protection cover and the data processing device;
    a front side supply/discharge device provided on a front side of the vehicle when mounted to the vehicle, and configured to supply or discharge air between an outside of the protection cover and the space;
    a rear side supply/discharge device provided on a rear side of the vehicle when mounted to the vehicle, and configured to supply or discharge the air between the outside of the protection cover and the space; and
    a supply/discharge control device configured to
        acquire at least one item of information on an internal temperature of the protection cover, an external temperature of the protection cover, a traveling direction of the vehicle, and presence or absence of a failure in the front side supply/discharge device or the rear side supply/discharge device, and
        control air supply and discharge operations of the front side supply/discharge device and the rear side supply/discharge device, based on the information that has been acquired,
    wherein, each of the front side supply/discharge device and the rear side supply/discharge device is a fan device including a plurality of fans that overlap with each other in an axial direction, and the supply/discharge control device is configured to individually control respective rotations of the plurality of fans.

\* \* \* \* \*